United States Patent
Ko et al.

(10) Patent No.: US 11,127,891 B2
(45) Date of Patent: Sep. 21, 2021

(54) COMPOUND SEMICONDUCTOR AND USE THEREOF

(71) Applicant: LG CHEM, LTD., Seoul (KR)

(72) Inventors: Kyung Moon Ko, Daejeon (KR); Cheol Hee Park, Daejeon (KR); Min Kyoung Kim, Daejeon (KR); Myung Jin Jung, Daejeon (KR); Chee Sung Park, Daejeon (KR)

(73) Assignee: LG CHEM, LTD., Seoul (KR)

( * ) Notice: Subject to any disclaimer, the term of this patent is extended or adjusted under 35 U.S.C. 154(b) by 416 days.

(21) Appl. No.: 16/304,085

(22) PCT Filed: Feb. 12, 2018

(86) PCT No.: PCT/KR2018/001828
§ 371 (c)(1),
(2) Date: Nov. 21, 2018

(87) PCT Pub. No.: WO2018/164386
PCT Pub. Date: Sep. 13, 2018

(65) Prior Publication Data
US 2020/0328335 A1     Oct. 15, 2020

(30) Foreign Application Priority Data

Mar. 9, 2017  (KR) .................... 10-2017-0030174

(51) Int. Cl.
| | |
|---|---|
| H01L 35/18 | (2006.01) |
| C01B 19/00 | (2006.01) |
| C01G 51/00 | (2006.01) |
| H01L 31/0272 | (2006.01) |
| H01L 35/16 | (2006.01) |
| H01L 35/34 | (2006.01) |

(52) U.S. Cl.
CPC .......... H01L 35/18 (2013.01); C01B 19/002 (2013.01); C01G 51/00 (2013.01); H01L 31/0272 (2013.01); H01L 35/16 (2013.01); H01L 35/34 (2013.01)

(58) Field of Classification Search
CPC ......... H01L 35/18; H01L 35/16; H01L 35/34; H01L 31/0272; C01B 19/002; C01G 51/00; C01G 51/006
See application file for complete search history.

(56) References Cited

U.S. PATENT DOCUMENTS

| | | |
|---|---|---|
| 4,061,505 A | 12/1977 | Hampl, Jr. |
| 2003/0056819 A1 | 3/2003 | Imai et al. |
| 2006/0118156 A1 | 6/2006 | Nakajima |
| 2010/0139730 A1 | 6/2010 | Bentien et al. |
| 2010/0170553 A1 | 7/2010 | Rhyee et al. |
| 2011/0036099 A1 | 2/2011 | Bari |
| 2011/0108778 A1 | 5/2011 | Ren et al. |
| 2011/0240081 A1 | 10/2011 | Rhyee et al. |
| 2013/0009116 A1 | 1/2013 | Park et al. |
| 2018/0145238 A1* | 5/2018 | Tanaka .................... H01L 35/34 |

FOREIGN PATENT DOCUMENTS

| | | |
|---|---|---|
| CN | 102709461 A | 10/2012 |
| EP | 2242121 A1 | 10/2010 |
| JP | 2001-196647 A | 7/2001 |
| JP | 2002-26400 A | 1/2002 |
| JP | 2004-76046 A | 3/2004 |
| JP | 2008-239363 A | 10/2008 |
| JP | 2013-506312 A | 2/2013 |
| JP | 2016-92174 A | 5/2016 |
| KR | 10-2011-0109564 A | 10/2011 |
| WO | WO 2012/157904 A1 | 11/2012 |

OTHER PUBLICATIONS

Duan et al., Electronegative guests in CoSb3, Energy Environ. Sci., 2016 (Year: 2016).*
Scherrer et al., Solar thermoelectric generator based on skuttertudites, Journal of Power Sources, 2003 (Year: 2003).*
Duan et al., "Energy & Environmental Science", Royal Society of Chemistry, Apr. 19, 2016, 9, 2090-2098, total of 29 pages.
International Search Report for PCT/KR2018/001828 (PCT/ISA/210) dated Jun. 7, 2018.
Kuznetsov, V.L., et al, "Effect of partial void filling on the transport properties of NdxCo4Sb12 skutterudites," Journal of Physics: Condensed Matter, 2003, vol. 15, pp. 5035-5048.
Extended European Search Report for European Application No. 18763294.8, dated Jan. 2, 2020.

* cited by examiner

*Primary Examiner* — Matthew T Martin
(74) *Attorney, Agent, or Firm* — Birch, Stewart, Kolasch & Birch, LLP

(57) ABSTRACT

A novel compound semiconductor that can be used for a solar battery, a thermoelectric material, and the like, and use thereof. The novel compound semiconductor may be represented by the following Chemical Formula: $Nd_xS_yCo_4Sb_{12-z}Q_z$, wherein Q is one or more selected from the O, Se, or Te, $0<x<0.2$, $0<y\leq1$, and $0<z<12$.

13 Claims, No Drawings

COMPOUND SEMICONDUCTOR AND USE THEREOF

CROSS-REFERENCE TO RELATED APPLICATION(S)

This application claims the benefit of Korean Patent Application No. 10-2017-0030174 filed on Mar. 9, 2017 with the Korean Intellectual Property Office, the disclosures of which is herein incorporated by reference in its entirety.

TECHNICAL FIELD

The present invention relates to novel compound semiconductor that can be used for a solar battery, a thermoelectric material, etc., a method for preparing the same, and a use thereof.

BACKGROUND ART

A compound semiconductor is a compound acting as a semiconductor, wherein two or more kinds of elements are bonded instead of a single element such as silicon or germanium. Currently, various kinds of compound semiconductors have been developed and are being used in various fields. Representatively, the compound semiconductor may be used for a thermoelectric conversion element using the Peltier effect, a light emitting device such as a light emitting diode, a laser diode, etc. using a photoelectric conversion effect, a solar battery, etc.

Among them, the thermoelectric conversion element may be applied for thermoelectric generation, thermoelectric cooling, etc., and the thermoelectric generation is the form of power generation that converts heat energy into electrical energy using thermoelectromotive force generated by causing a temperature difference in a thermoelectric conversion element.

The energy conversion efficiency of the thermoelectric conversion element depends on the figure of merit (ZT) of the thermoelectric conversion material. Here, ZT is determined according to the Seebeck coefficient, electrical conductivity, thermal conductivity, etc., and more specifically, it is proportional to the square of the Seebeck coefficient and electrical conductivity, and is inversely proportional to thermal conductivity. Thus, in order to increase the energy conversion efficiency of the thermoelectric conversion element, the development of a thermoelectric conversion material having a high Seebeck coefficient or electrical conductivity, or low thermal conductivity, is required.

Meanwhile, since a solar battery is environmentally friendly in that a separate energy source is not required in addition to sunlight existing in nature, it is being actively studied as a future replacement energy source. A solar battery may be divided into a silicon solar battery mainly using a single element of silicon, a compound semiconductor solar battery using a compound semiconductor, a tandem solar battery wherein two or more solar batteries having different band gap energy are stacked, etc.

Among them, the compound semiconductor solar battery uses a compound semiconductor in a photo-absorbing layer that absorbs sunlight to form an electron-hole pair, and particularly, A Group V compound semiconductor such as GaAs, InP, GaAlAs, GaInAs, etc., a Group VI compound semiconductor such as CdS, CdTe, ZnS, etc., and a Group III compound semiconductor represented by $CuInSe_2$, etc. may be used.

The photo-absorbing layer of a solar battery is required to have excellent long term electrical and optical stability, have high photoelectric conversion efficiency, and to make it easy to control the band gap energy or conductive type by composition change or doping, etc. Further, for commercialization, requirements such as manufacturing cost, yield, etc. should be satisfied. However, many existing compound semiconductors fail to simultaneously satisfy such requirements.

DETAILED DESCRIPTION OF THE INVENTION

Technical Problem

In order to solve the above problems, it is an object of the present invention to provide a novel compound semiconductor that can be applied for various uses such as a thermoelectric conversion material of a thermoelectric conversion element, a solar battery, etc., a method for preparing the same, and a thermoelectric conversion element or solar battery using the same.

Other objects and advantages of the present invention can be understood by the explanations below, and can be clearly understood by examples of the present invention. In addition, the objects and advantages of the present invention can be realized by means described in the claims and combinations thereof.

Technical Solution

In order to overcome the above objects, as a result of repeated studies on compound semiconductors, the present inventors succeeded in synthesizing a compound semiconductor represented by the following Chemical Formula 1, confirmed that the compound can be used for a thermoelectric conversion material of a thermoelectric conversion element or a photo-absorbing layer of a solar battery, and completed the present invention.

Hereinafter, preferable examples of the present invention will be explained in detail. First, the terms or words used in the specification and claims should not be limitedly interpreted as common or dictionary meanings, but they should be interpreted as the meanings and concepts corresponding to the technical idea of the present invention, based on the principle that the inventors can appropriately define the concepts of terms so as to explain one's own invention in the best way.

Thus, the construction described in the examples of the specification are no more than a most preferable example of the present invention, and does not represent all the technical ideas of the present invention, and thus it should be understood that various equivalents and modifications replacing the same can be made.

The present invention provides a novel compound semiconductor represented by the following Chemical Formula 1.

$$Nd_xS_yCo_4Sb_{12-z}Q_z \qquad \text{[Chemical Formula 1]}$$

In Chemical Formula 1, Q is one or more selected from the group consisting of O, Se, and Te, $0<x<0.2$, $0<y\le1$ and $0<z<12$.

In Chemical Formula 1, Nd is the symbol of an element indicating a neodymium element, S is the symbol of an element indicating a sulfur element, Co is the symbol of an element indicating a cobalt element, Sb is the symbol of an element indicating an antimony element, and Q means one or more kinds of elements selected from the group consisting of oxygen, selenium, and tellurium.

Further, in Chemical Formula 1, x is the relative mole ratio of the neodymium element, y is the relative mole ratio of the sulfur element, and z is the relative mole ratio of one or more elements selected from the group consisting of oxygen (O), selenium (Se), and tellurium (Te).

Preferably, in Chemical Formula 1, Q may be Se or Te.

More preferably, in Chemical Formula 1, Q may be Te.

By introducing Q at the Sb site in Chemical Formula 1, the carrier concentration may increase, and thus electrical properties of the compound semiconductor of Chemical Formula 1 may be improved.

Further, preferably, in Chemical Formula 1, x satisfies $0.01 \leq x \leq 0.18$.

More preferably, in Chemical Formula 1, x satisfies $0.025 \leq x \leq 0.1$.

If x increases above 0.2 in Chemical Formula 1, Nd and S cannot be positioned in the empty space in the Co—Sb lattice and a Nd—Sb-based secondary phase is formed, and thus the thermal conductivity of the compound semiconductor of Chemical Formula 1 may rapidly increase and the thermoelectric figure of merit may decrease. Examples of the Nd—Sb-based secondary phase may include compounds such as NdSb, $NdSb_2$, etc.

Further, preferably, in Chemical Formula 1, y satisfies $0<y \leq 0.5$ or $0.1 \leq y \leq 0.2$.

In Chemical Formula 1, Nd is an electron donor, and can optimize an output factor through carrier concentration tuning, and rare earth elements such as lanthanide series or actinide series elements may be used instead.

Further, in Chemical Formula 1, S is a filling element having high electronegativity, and forms a polar covalent bond with Sb and produces a new vibration mode, thus functioning for lowering lattice thermal conductivity.

Thus, since the compound semiconductor of Chemical Formula 1 according to the present invention includes Nd and S together, it has high oxidation stability even at a high temperature, and thus can improve durability in a thermoelectric module while minimizing process cost, and in addition, the thermoelectric conductivity of the compound semiconductor of Chemical Formula 1 may be remarkably decreased, thereby realizing improved thermoelectric performance.

In Chemical Formula 1, the relationship between the relative mole ratio of neodymium (x) and the relative mole ratio of sulfur (y) may satisfy $x \leq y$. That is, in Chemical Formula 1, the sulfur element may be included in an excess amount or an equal amount, compared to the neodymium element.

Specifically, in Chemical Formula 1, the mole ratio of x to 1 mole of y may be 0.1 to 1, or 0.125 to 1.

Preferably, in Chemical Formula 1, z satisfies $0<z \leq 4$.

More preferably, in Chemical Formula 1, z satisfies $0<z \leq 2.5$.

Most preferably, in Chemical Formula 1, z satisfies $0<z \leq 1.5$.

Meanwhile, in Chemical Formula 1, the relationship between the relative mole ratio (x) of the neodymium element and the relative mole ratio (z) of one or more elements selected from the group consisting of oxygen, selenium, and tellurium may satisfy the requirement that the mole ratio of x to 1 mole of z is 0.01 to 0.5, or 0.01 to 0.3.

That is, in Chemical Formula 1, the one or more elements selected from the group consisting of oxygen, selenium, and tellurium may be included in an excess amount or an equal amount, compared to the neodymium element.

In Chemical Formula 1, if the mole ratio of x to 1 mole of z is greater than 0.5, the thermal conductivity of the compound semiconductor of Chemical Formula 1 may rapidly increase, and thus the thermoelectric figure of merit may decrease. Further, if the mole ratio of x to 1 mole of z is less than 0.01, the content of Nd in the compound semiconductor of Chemical Formula 1 may not be sufficient, and thus it may be difficult to sufficiently realize the effect resulting from the addition of Nd.

Meanwhile, in the compound semiconductor represented by Chemical Formula 1, secondary phases may be included in part, and the amount may vary according to the heat treatment conditions.

The compound semiconductor according to the present invention may be prepared by forming a mixture including Nd, S, Co, Sb, and one or more elements selected from the group consisting of O, Se, and Te, and heat treating the mixture. The one or more elements selected from the group consisting of O, Se and Te means O, Se, Te alone or combinations of two or more kinds thereof.

Meanwhile, in the step of forming a mixture, each raw material to be mixed may be in the form of a powder, but the present invention is not necessarily limited to the specific form of raw materials.

Further, preferably, the heat treatment may be conducted in a vacuum, or may be conducted while flowing gas such as Ar, He, or $N_2$ that includes hydrogen or does not include hydrogen.

Here, the heat treating temperature may be 400° C. to 800° C. Preferably, the heat treating temperature may be 450° C. to 700° C. More preferably, the heat treating temperature may be 500° C. to 700° C.

Meanwhile, the heat treating step may include two or more heat treating steps. For example, a mixture formed in the step of forming the mixture, i.e., the step of mixing raw materials, may be subjected to primary heat treatment at a first temperature, and then subjected to secondary heat treatment at a second temperature.

In this case, a part of the multiple heat treatment steps may be conducted during the step of forming a mixture in which raw materials are mixed.

For example, the heat treatment step may include three heat treatment steps of a primary heat treatment step, a secondary heat treatment step, and a tertiary heat treatment step. Further, the primary heat treatment step may be conducted at a temperature of 400° C. to 600° C. and the secondary and tertiary heat treatment steps may be conducted at a temperature of 600° C. to 800° C., wherein the primary heat treatment step may be conducted during the step of forming a mixture where raw materials are mixed, and thereafter, the secondary and tertiary heat treatment steps may be sequentially conducted.

After the heat treatment step, a step of cooling the heat treated mixture may be further conducted. The cooling step is conducted by decreasing the temperature of the heat treated mixture to room temperature (about 20° C. to 30° C.), and various cooling methods or apparatuses previously known may be used without limitations.

Meanwhile, for the heat treated mixture, or the mixture that is heat treated and then cooled, as necessary, a step of pressurized sintering may be further conducted. The specific method for progressing the pressurized sintering step is not specifically limited, but specifically, a hot press method or a spark plasma sintering (SPS) method may be used. Further, the pressurized sintering step may be progressed at a temperature of 500° C. to 700° C. and a pressure of 20 MPa to 50 MPa for 10 to 60 minutes.

If the sintering temperature is less than 500° C. or the sintering time is short and the pressure is low, a high density sintered body cannot be obtained. Further, if the pressure is high, a danger to applied mold and equipment may be caused.

Particularly, the spark plasma sintering (SPS) method may be preferably used. The spark plasma sintering (SPS) is a sintering method of applying a direct current pulse in a direction parallel to the pressurization direction while uniaxially pressurizing a powder or plate, wherein pressure and low voltage high current are introduced to the powder or plate, and the high energy of plasma that is instantly generated by a spark generated at this time is applied for electrical diffusion, thermal diffusion, etc. Since such spark plasma sintering has a lower sintering temperature compared to the existing hot press method, and can complete sintering within a short time including temperature raising and maintaining times, power consumption may be largely reduced, handling is convenient, and running cost is inexpensive. Further, skills for sintering technology are not required, and it can be applied even for a hardly sinterable material and materials that are difficult to process at high temperature.

Further, before progressing the pressurized sintering step, a step of grinding the heated mixture or the mixture that is heat treated and then cooled, as necessary, may be further conducted. The grinding method is not specifically limited, and various grinding methods and apparatuses that are previously known may be applied without limitations.

The thermoelectric conversion element according to the present invention may include the above-explained compound semiconductor. That is, the compound semiconductor according to the present invention may be used as a thermoelectric conversion material of a thermoelectric conversion element. Particularly, the compound semiconductor according to the present invention has high ZT, which is the figure of merit of the thermoelectric conversion material. Further, it has a high Seebeck coefficient and electrical conductivity, and low thermal conductivity, and thus has excellent thermoelectric conversion performance. Thus, the compound semiconductor according to the present invention may replace the conventional thermoelectric conversion material, or may be usefully used in a thermoelectric conversion element in addition to the conventional thermoelectric conversion material.

Further, the solar battery according to the present invention may include the above-explained compound semiconductor. That is, the compound semiconductor according to the present invention may be used for a solar battery, particularly as a photo-absorbing layer of a solar battery.

Specifically, a solar battery may be manufactured as a structure wherein a front transparent electrode, a buffer layer, a photo-absorbing layer, a rear electrode, a substrate, etc. are stacked sequentially from the side where sunlight enters. The substrate positioned at the lowest part may be made of glass, and the rear electrode formed thereon may be formed by depositing a metal such as Mo, etc.

Subsequently, on the rear electrode, the compound semiconductor according to the present invention may be stacked by electron beam evaporation, a sol-gel method, PLD (Pulsed Laser Deposition), etc., to form the photo-absorbing layer. On the photo-absorbing layer, a buffer layer that buffers a lattice constant difference and a band gap difference between a ZnO layer used for a front transparent electrode and the photo-absorbing layer may exist, and such a buffer layer may be formed by depositing a material such as CdS, etc. by CBD (Chemical Bath Deposition), etc. Next, on the buffer layer, a front transparent electrode may be formed as a stacked film of ZnO or ZnO and ITO by sputtering, etc.

The solar battery according to the present invention may be variously modified. For example, a tandem solar battery wherein the solar battery using the compound semiconductor according to the present invention as a photo-absorbing layer is stacked may be manufactured. Further, as other solar batteries stacked together, solar batteries using silicon or other known compound semiconductors may be used.

Further, by changing the band gap of the compound semiconductor of the present invention, multiple solar batteries that use compound semiconductors with different band gaps as photo-absorbing layers may be stacked. The band gap of the compound semiconductor according to the present invention may be controlled by changing the compositional ratio of the elements constituting the compound, particularly, Te.

Further, the compound semiconductor according to the present invention may be applied for an IR window that selectively passes infrared rays, an infrared ray sensor, etc.

Advantageous Effects

According to the present invention, a novel compound semiconductor material is provided. According to one aspect of the present invention, such novel compound semiconductor may replace the existing compound semiconductor, or may be used as another material in addition to the existing compound semiconductor.

Moreover, according to one aspect of the present invention, the compound semiconductor has good thermoelectric conversion performance, and thus can be useful for a thermoelectric conversion material. Particularly, the compound semiconductor according to the present invention may be used as a thermoelectric conversion material of a thermoelectric conversion element.

According to another aspect of the present invention, the compound semiconductor may be used for a solar battery. Particularly, the compound semiconductor according to the present invention may be use as a photo-absorbing layer of a solar battery.

According to yet another aspect of the present invention, the compound semiconductor may be used in an IR window selectively passing infrared rays, an infrared ray sensor, a magnetic device, a memory, etc.

DETAILED DESCRIPTION OF THE EMBODIMENTS

The present invention will be explained in more detail in the following examples. However, these examples are presented only as the illustrations of the present invention, and the scope of the present invention is not limited thereby.

EXAMPLES 1 TO 5: PREPARATION OF COMPOUND SEMICONDUCTOR

Example 1

In order to synthesize $Nd_{0.025}S_{0.2}Co_4Sb_{11.4}Te_{0.6}$, powder form Nd, S, Co, Sb, and Te were weighed, and then were put in an alumina mortar and mixed. The mixed materials were put in a carbide mold to make pellets, which were put in a fused silica tube and vacuum sealed. The pellets were put in a box furnace and heated at 680° C. for 15 hours, and then gradually cooled to synthesize $Nd_{0.025}S_{0.2}Co_4Sb_{11.4}Te_{0.6}$.

Further, the synthesized compound was put in a graphite mold for spark plasma sintering, and then spark plasma sintering was conducted at a temperature of 650° C. and a pressure of 50 MPa for 10 minutes to prepare a compound semiconductor of Example 1. Here, the relative density of the obtained compound semiconductor was measured to be 98% or more.

Example 2

A compound semiconductor was prepared by the same method as Example 1, except that the composition of the mixture was changed to $Nd_{0.05}S_{0.2}Co_4Sb_{11.4}Te_{0.6}$.

Example 3

A compound semiconductor was prepared by the same method as Example 1, except that the composition of the mixture was changed to $Nd_{0.075}S_{0.2}Co_4Sb_{11.4}Te_{0.6}$.

Example 4

A compound semiconductor was prepared by the same method as Example 1, except that the composition of the mixture was changed to $Nd_{0.1}S_{0.1}Co_4Sb_{11.4}Te_{0.6}$.

Example 5

A compound semiconductor was prepared by the same method as Example 1, except that the composition of the mixture was changed to $Nd_{0.1}S_{0.2}Co_4Sb_{11.4}Te_{0.6}$.

COMPARATIVE EXAMPLES 1 TO 3: PREPARATION OF COMPOUND SEMICONDUCTOR

Comparative Example 1

A compound semiconductor was prepared by the same method as Example 1, except that Co, Sb, and Te were prepared as reagents, and the composition of the mixture was changed to $Co_4Sb_{11.4}Te_{0.6}$.

Comparative Example 2

A compound semiconductor was prepared by the same method as Example 1, except that Nd, Co, Sb, and Te were prepared as reagents, and the composition of the mixture was changed to $Nd_{0.1}Co_4Sb_{11.4}Te_{0.6}$.

Comparative Example 3

A compound semiconductor was prepared by the same method as Example 1, except that S, Co, Sb, and Te were prepared as reagents, and the composition of the mixture was changed to $S_{0.2}Co_4Sb_{11.4}Te_{0.6}$.

Experimental Examples: Measurement of the Properties of the Compound Semiconductors Obtained in Examples and Comparative Examples The properties of the compound semiconductors obtained in the examples and comparative examples were measured as follows, and the results are shown in the following Tables 1 and 2.

1. Lattice Thermal Conductivity (W/mK)

Specifically, the compound semiconductors obtained in the examples and comparative examples were processed into coin-type having a diameter of 12.7 mm and a height of 1.5 mm to manufacture specimens. Thermal conductivity of the specimens was calculated from the measurement values of thermal diffusivity according to a laser flash method (Netzsch, LFA-457) in the range of 50° C. to 500° C. specific heat, and density, and then a Lorenz number was calculated and the value was applied for the calculated thermal conductivity to obtain lattice thermal conductivity, and the results are shown in the following Table 1.

TABLE 1

Thermal conductivities of the compound semiconductors of examples and comparative examples

|  | Temperature (° C.) | Thermal conductivity (W/mK) |
| --- | --- | --- |
| Example 1 | 50 | 1.99 |
|  | 100 | 1.86 |
|  | 200 | 1.64 |
|  | 300 | 1.48 |
|  | 400 | 1.36 |
|  | 500 | 1.28 |
| Example 2 | 50 | 1.89 |
|  | 100 | 1.76 |
|  | 200 | 1.54 |
|  | 300 | 1.39 |
|  | 400 | 1.28 |
|  | 500 | 1.21 |
| Example 3 | 50 | 1.91 |
|  | 100 | 1.79 |
|  | 200 | 1.58 |
|  | 300 | 1.43 |
|  | 400 | 1.32 |
|  | 500 | 1.26 |
| Example 4 | 50 | 2.13 |
|  | 100 | 1.98 |
|  | 200 | 1.73 |
|  | 300 | 1.54 |
|  | 400 | 1.40 |
|  | 500 | 1.30 |
| Example 5 | 50 | 1.89 |
|  | 100 | 1.76 |
|  | 200 | 1.55 |
|  | 300 | 1.39 |
|  | 400 | 1.29 |
|  | 500 | 1.23 |
| Comparative Example 1 | 50 | 3.33 |
|  | 100 | 3.07 |
|  | 200 | 2.65 |
|  | 300 | 2.32 |
|  | 400 | 2.09 |
|  | 500 | 1.94 |
| Comparative Example 2 | 50 | 3.17 |
|  | 100 | 2.92 |
|  | 200 | 2.49 |
|  | 300 | 2.16 |
|  | 400 | 1.92 |
|  | 500 | 1.77 |
| Comparative Example 3 | 50 | 2.19 |
|  | 100 | 2.04 |
|  | 200 | 1.80 |
|  | 300 | 1.62 |
|  | 400 | 1.51 |
|  | 500 | 1.44 |

As shown in Table 1, it was confirmed that in the case of the compounds semiconductors of Examples 1 to 5, since Nd and S were filled together at a ratio of 1:1 to 1:8, lattice thermal conductivities decreased at each measuring temperature, compared to Comparative Examples 1 to 3.

2. Thermoelectric Figure of Merit (ZT)

The compound semiconductors obtained in the examples and comparative examples were processed to be rectangular with a width of 3 mm, a length of 3 mm, and a height of 12 mm to manufacture specimens. Electrical conductivity and Seebeck coefficient of the specimens were measured using a ZEM-3 tester (Ulvac-Rico, Inc.) in the range of 50° C. to 500° C.

Further, using the measured electric conductivity, Seebeck coefficient, and the thermal conductivity of Experimental Example 1 explained above, the thermoelectric figure of merit (ZT) was calculated through the following mathematical formula, and the results are shown in the following Table 2.

$$ZT = \sigma S^2 T/K \qquad \text{[Mathematical Formula]}$$

Herein, ZT denotes thermoelectric figure of merit, $\sigma$ denotes electrical conductivity, S denotes Seebeck coefficient, T denotes temperature, and K denotes thermal conductivity.

TABLE 2

Thermoelectric figure of merit of the compound semiconductors of examples and comparative examples

| | Temperature (° C.) | Thermoelectric figure of merit |
|---|---|---|
| Example 1 | 50 | 0.27 |
| | 100 | 0.36 |
| | 200 | 0.58 |
| | 300 | 0.82 |
| | 400 | 1.05 |
| | 500 | 1.27 |
| Example 2 | 50 | 0.28 |
| | 100 | 0.37 |
| | 200 | 0.60 |
| | 300 | 0.86 |
| | 400 | 1.12 |
| | 500 | 1.35 |
| Example 3 | 50 | 0.27 |
| | 100 | 0.37 |
| | 200 | 0.30 |
| | 300 | 0.85 |
| | 400 | 1.09 |
| | 500 | 1.28 |
| Example 4 | 50 | 0.25 |
| | 100 | 0.34 |
| | 200 | 0.55 |
| | 300 | 0.78 |
| | 400 | 1.01 |
| | 500 | 1.23 |
| Example 5 | 50 | 0.28 |
| | 100 | 0.38 |
| | 200 | 0.62 |
| | 300 | 0.87 |
| | 400 | 1.12 |
| | 500 | 1.32 |
| Comparative Example 1 | 50 | 0.18 |
| | 100 | 0.25 |
| | 200 | 0.40 |
| | 300 | 0.58 |
| | 400 | 0.76 |
| | 500 | 0.93 |
| Comparative Example 2 | 50 | 0.19 |
| | 100 | 0.26 |
| | 200 | 0.42 |
| | 300 | 0.61 |
| | 400 | 0.81 |
| | 500 | 1.00 |

TABLE 2-continued

Thermoelectric figure of merit of the compound semiconductors of examples and comparative examples

| | Temperature (° C.) | Thermoelectric figure of merit |
|---|---|---|
| Comparative Example 3 | 50 | 0.25 |
| | 100 | 0.34 |
| | 200 | 0.54 |
| | 300 | 0.76 |
| | 400 | 0.98 |
| | 500 | 1.18 |

As shown in Table 2, it was confirmed that in the case of the compound semiconductors of Examples 1 to 5, since Nd and S were filled together at a ratio of 1:1 to 1:8, the thermoelectric figure of merit was improved at each measuring temperature, compared to Comparative Examples 1 to 3.

The invention claimed is:

1. A compound semiconductor represented by the following Chemical Formula 1:

$$Nd_xS_yCo_4Sb_{12-z}Q_z \qquad \text{[Chemical Formula 1]}$$

wherein, in Chemical Formula 1, Q is one or more selected from the group consisting of O, Se, and Te, 0<x<0.2, 0<y≤1, and 0<z<12.

2. The compound semiconductor according to claim 1, wherein, in Chemical Formula 1, x≤y.

3. The compound semiconductor according to claim 1, wherein a mole ratio of x to 1 mole of y in Chemical Formula 1 is 0.1 to 1.

4. The compound semiconductor according to claim 1, wherein the z in Chemical Formula 1 is 0<z≤4.

5. The compound semiconductor according to claim 1, wherein a mole ratio of x to 1 mole of z in Chemical Formula 1 is 0.01 to 0.5.

6. The compound semiconductor according to claim 1, wherein a mole ratio of x to 1 mole of z in Chemical Formula 1 is 0.01 to 0.3.

7. A method for preparing the compound semiconductor of claim 1, comprising the steps of:
forming a mixture comprising Nd, S, Co, Sb, and one or more elements selected from the group consisting of O, Se, and Te; and
heat treating the mixture.

8. The method for preparing the compound semiconductor according to claim 7, wherein the heat treating step is conducted at 400° C. to 800° C.

9. The method for preparing the compound semiconductor according to claim 7, wherein the heat treating step comprises two or more heat treating steps.

10. The method for preparing the compound semiconductor according to claim 7, further comprising a pressurized sintering step, after the heat treating step.

11. A thermoelectric conversion element comprising the compound semiconductor according to claim 1.

12. A solar battery comprising the compound semiconductor according to claim 1.

13. The compound semiconductor according to claim 1, wherein Nd and S are filled at a ratio of 1:1 to 1:8.

* * * * *